US011674235B2

United States Patent
Riemer et al.

(10) Patent No.: US 11,674,235 B2
(45) Date of Patent: Jun. 13, 2023

(54) PLATING METHOD TO REDUCE OR ELIMINATE VOIDS IN SOLDER APPLIED WITHOUT FLUX

(71) Applicant: Hutchinson Technology Incorporated, Hutchinson, MN (US)

(72) Inventors: Douglas P. Riemer, Waconia, MN (US); Peter F. Ladwig, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/366,064

(22) Filed: Mar. 27, 2019

(65) Prior Publication Data

US 2019/0316267 A1 Oct. 17, 2019

Related U.S. Application Data

(60) Provisional application No. 62/656,209, filed on Apr. 11, 2018.

(51) Int. Cl.
*C25D 3/48* (2006.01)
*C25D 3/62* (2006.01)
(Continued)

(52) U.S. Cl.
CPC ............... *C25D 7/00* (2013.01); *C25D 3/48* (2013.01); *H05K 1/09* (2013.01); *H05K 3/188* (2013.01);
(Continued)

(58) Field of Classification Search
CPC ... C25D 3/12; C25D 3/38; C25D 3/46; C25D 3/48; C25D 3/50; C25D 3/56;
(Continued)

(56) References Cited

U.S. PATENT DOCUMENTS 2,317,242 A 4/1943 Allen et al.
2,737,488 A 3/1956 Gray
(Continued)

FOREIGN PATENT DOCUMENTS

JP 2002-198635 A 7/2002
JP 2017-25359 A 2/2017
(Continued)

OTHER PUBLICATIONS

International Search Report and Written Opinion in International Application No. PCT/US2019/024972, dated Jun. 11, 2019.
(Continued)

*Primary Examiner* — Edna Wong
(74) *Attorney, Agent, or Firm* — DLA Piper LLP (US)

(57) ABSTRACT

A method of plating a copper substrate with gold that reduces or eliminates the presence of microvoids at the interface of the gold/copper substrate is described. Suitably, live entry of the substrate into the plating bath is performed with application of external current to the bath such that no portion of the substrate is exposed to the bath for more than one second without the application of the external current. Increase of the applied current for gold strike to the mass-transfer-limit for gold reduction accomplishes the full measure of improvement in eliminating microvoids.

5 Claims, 7 Drawing Sheets

(51) Int. Cl.
  *C25D 5/04* (2006.01)
  *C25D 5/18* (2006.01)
  *C25D 7/00* (2006.01)
  *H05K 3/18* (2006.01)
  *H05K 1/09* (2006.01)
  *C25D 5/10* (2006.01)
  *C25D 5/00* (2006.01)

(52) U.S. Cl.
  CPC ............... *C25D 5/10* (2013.01); *C25D 5/623* (2020.08); *H05K 2201/0347* (2013.01); *H05K 2203/0723* (2013.01)

(58) Field of Classification Search
  CPC .......... C25D 3/562; C25D 3/567; C25D 3/58; C25D 3/62; C25D 3/64; C25D 5/04; C25D 5/18
  USPC ....... 205/238, 242, 247, 248, 255, 257, 263, 205/264, 265, 266, 271, 291, 137
  See application file for complete search history.

(56) References Cited

U.S. PATENT DOCUMENTS

| | | | |
|---|---|---|---|
| 3,535,212 A | 10/1970 | Dobrash et al. | |
| 3,845,364 A * | 10/1974 | Shoot | H01G 9/0425 361/516 |
| 4,199,416 A * | 4/1980 | Middleton | C25D 3/62 205/250 |
| 5,236,566 A | 8/1993 | Tsuchiya et al. | |
| 5,374,344 A | 12/1994 | Gall et al. | |
| 5,792,565 A | 8/1998 | Cupolo et al. | |
| 6,024,846 A | 2/2000 | Legoupil | |
| 6,074,544 A | 6/2000 | Reid et al. | |
| 6,589,399 B1 | 7/2003 | Shimamura et al. | |
| 6,676,823 B1 * | 1/2004 | Bokisa | C25D 3/38 106/1.26 |
| 6,946,065 B1 | 9/2005 | Mayer et al. | |
| 6,991,717 B2 | 1/2006 | King et al. | |
| 2005/0029106 A1 * | 2/2005 | Baniahmad | C25D 21/12 205/81 |
| 2005/0155866 A1 | 7/2005 | Gabe et al. | |
| 2006/0175203 A1 | 8/2006 | Davis et al. | |
| 2006/0283714 A1 * | 12/2006 | Egli | C25D 3/62 205/242 |
| 2012/0067733 A1 * | 3/2012 | Zhang-Beglinger | C25D 5/10 205/263 |
| 2014/0224661 A1 * | 8/2014 | Spurlin | C25D 21/12 205/104 |
| 2015/0167191 A1 | 6/2015 | Cordonier et al. | |
| 2016/0254608 A1 | 9/2016 | Takahashi | |
| 2016/0348260 A1 * | 12/2016 | Takahashi | C25D 5/505 |
| 2017/0159195 A1 * | 6/2017 | Breitfelder | C25D 3/62 |
| 2018/0212350 A1 * | 7/2018 | Tamura | H01R 4/184 |

FOREIGN PATENT DOCUMENTS

| | | |
|---|---|---|
| JP | 3211820 U | 8/2017 |
| WO | 2011/118537 A1 | 9/2011 |
| WO | 2013/018473 A1 | 2/2013 |
| WO | 2014/080958 A1 | 5/2014 |

OTHER PUBLICATIONS

International Preliminary Report on Patentability in International Application No. PCT/US2019/024972, dated Oct. 22, 2020.
Notice of Reasons for Refusal in Japanese Application No. 2020-555498, dated Jan. 10, 2023.

* cited by examiner

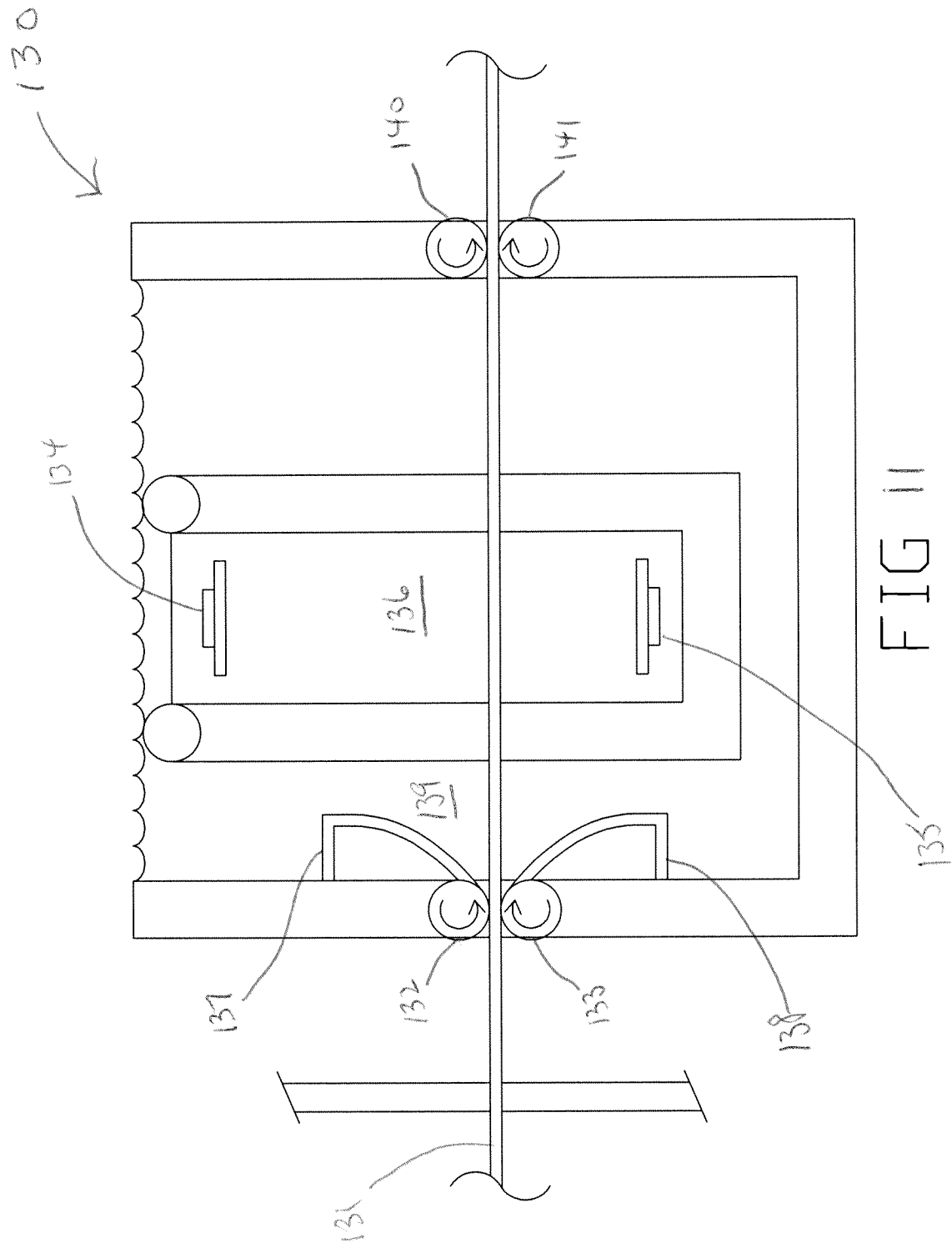

PLATING METHOD TO REDUCE OR ELIMINATE VOIDS IN SOLDER APPLIED WITHOUT FLUX

CROSS REFERENCE TO RELATED APPLICATION

This application claims the benefit of, and priority to, U.S. Provisional Patent Application Ser. No. 62/656,209, filed Apr. 11, 2018, entitled PLATING METHOD TO REDUCE OR ELIMINATE VOIDS IN SOLDER APPLIED WITHOUT FLUX, the entire disclosure of which is hereby incorporated by reference.

FIELD

Defects in solder joints were analyzed to determine why electro-plated copper solder joints were subject to failure. The defect in solder joints, especially in printed circuit boards (hereinafter "PCB") was widely experienced across industries making and using PCBs, but the root cause of the problem had yet to be determined prior to this disclosure. The present inventors, after extensive study, came to the discovery that it was the presence of microvoids at the interface of the plated metal on copper that was the cause of later formed solder joints to fail. The present inventors discovered a process of metal plating the copper substrates that eliminated the formation of microvoids at the plated metal-substrate interface, which was the root cause of subsequent failure of the solder joint.

BACKGROUND

Metal plating processes are generally known as described in the book by Paunovic and Schlesinger, "Fundamentals of Electrochemical Deposition." While the text does not directly explain how one would want to set actual parameters of a metal plating process, it is thorough in its description of the deposition process from nucleation to growth and what variables influence those processes from a first-principles point of view. It is by the authors that have made much of modern electrochemical deposition processes known. In addition, fundamentals of electrochemistry from a thermodynamic point of view may be found in John Newman's "Electrochemical Systems." Thermodynamic interactions are a key to understanding the selection of process settings and the origin of the defect being eliminated. The root cause of the defect, voids in the plate at the plated metal/substrate interface, has been confirmed by examination of commercial products. The texts of Fundamentals of Electrochemical Deposition and Electrochemical Systems are herein incorporated by reference in their entirety. IPC-A-610-D allows a maximum amount of voids by area in an X-ray to be no more than 25% of the wetted area of the solder. Another document, IPC-7095 states a much more stringent requirement, that no single void may occupy more than 4% of the area. For a 100×120 micron pad, that means a maximum diameter of 24 microns.

Some electrochemical plating of metals on a metallic strip are described in U.S. Pat. No. 2,317,242, issued Apr. 20, 1943 and in particular, a vertical type stream plating processes which is described in U.S. Pat. No. 5,236,566 issued Aug. 17, 1993, each of which are herein incorporated by reference. The failure of solder joints on electroplated substrates occurred well after the respective disclosures of these patents.

Recognizing the root cause of the defect, the present inventors formulated a process of metal plating over a substrate which does not create microvoids at the plated metal/substrate interface. Having accomplished the process of eliminating these microvoids, the failure of solder joints on plated metal/substrate interface dramatically decreased.

SUMMARY

The present process of electroplating a metal on a substrate avoids the creation of microvoids at the plated metal/substrate interface. As the plated metal usually is gold, but could be any of the coinage metals of the old IUPAC group IB (current IUPAC group 11) or the nickel group (current IUPAC group 10) of the Periodic Table, including platinum, palladium, silver and gold, gold will be exemplified as the plating metal for subsequent ease of disclosure. The substrates can also be any of a metal which can be plated by gold on other metals. In PCBs currently being produced, copper is the predominant metal being employed as the substrate, but it should be recognized that other metals and metal composites, can act as the substrate.

In one embodiment, we have discovered that the existence, or creation, during an electroplating process of microvoids in the plated gold/copper substrate interface will cause subsequent solder joint failure, not because of a defect in the solder itself, nor the combination of the solder with fluxes and other components of the solder, but because of the microvoids at the interface of the gold/copper.

In a further embodiment, we have devised a vertical type plating process where a substrate, such as copper, is lowered in a bath containing the electroplating metal, including other bath components, such as an acid, to maintain the plating metal in solution, wherein the initial lowering of the substrate into the acid-containing plating metal bath does not form corrosion or microvoid creating sites on the substrate entering the bath.

In a still further embodiment, we employ a vertical type plating process or "live-entry" wherein a copper substrate is lowered in an acid-containing bath of a plating metal, wherein initial current is applied between the substrate, acting as a cathode, and an anode in the bath, or acting as at least part of the container for the bath, such that no corrosion or sites for the creation of microvoids are caused to be formed in the substrate.

In another embodiment of reel to reel plating, we suppress immersion plating after we have fully immersed the substrate into the plating bath. The creation of nuclei upon the substrate during immersion has a deleterious effect upon subsequent plating. Subsequent application of current upon an immersed substrate having nuclei thereon preferentially causes grains to grow from these nuclei with an inverted cone shape until the grains grow together creating voids left in between the inverted cones, which is a root cause of voids in the solder joint. In this embodiment, it is necessary to begin plating of the gold on the copper as soon as the copper enters the bath in order to prevent the creation of immersion plated nuclei. Moreover, we raise the applied current density as the substrate is immersed into the bath maintaining the current density to that corresponding to near the mass-transfer-limit for gold deposition as both live-entry and increased current density are necessary to accomplish proper nucleation of the substrate.

These and other objects of the disclosure will be better understood in view of the detailed description when read in conjunction with the appended drawings.

BRIEF DESCRIPTION OF THE DRAWINGS

Embodiments of the present invention are illustrated, by way of example and not limitation, in the figures of the accompanying drawings, in which like references indicate similar elements and in which.

DETAILED DESCRIPTION OF THE EMBODIMENTS

Figure 1:
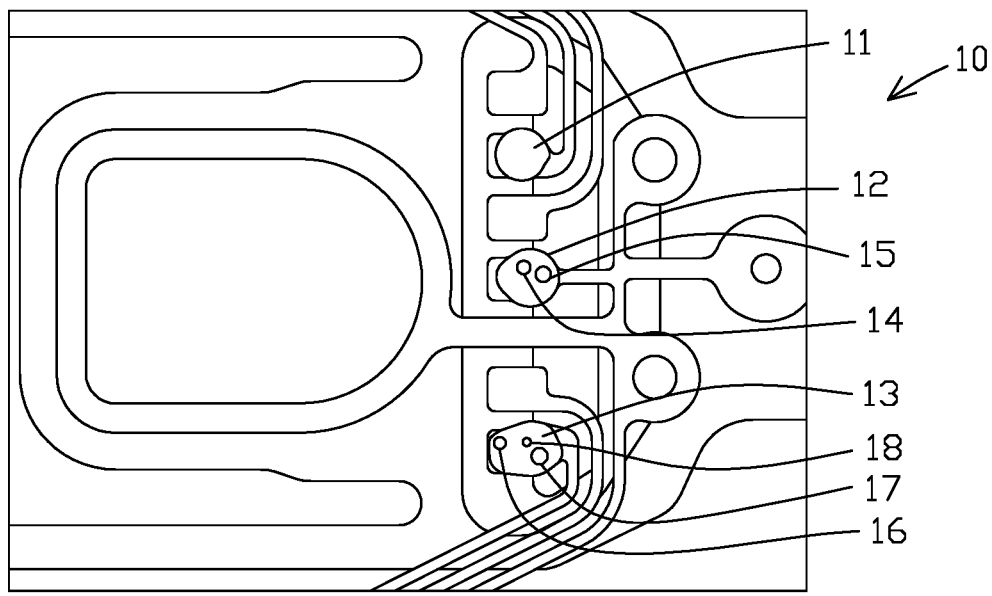
FIG. 1 is an X-ray of a PCB with solder joints exhibiting voids therein.

As shown in FIG. 1, which is an X-ray of solder joints 11, 12 and 13 in a PCB 10, voids 14, 15 can clearly be seen in solder joint 12. Voids 16, 17 and 18 can be seen in solder joint 13. Voids of 15-30 µm are classified as "type 2." Type 1 voids have a diameter of less than 15 µm. Solder joint 11 does not exhibit visible voids at this magnification. The elimination of these voids, or any voids that cause subsequent failure of a solder joint when made upon a metal-plated substrate, is the subject matter of a first embodiment of the invention. Microvoids in solder joints are voids smaller than 1 mil (25 µm) in diameter, generally found at the solder to land interfaces in one plane. Planar microvoids impact on solder joint reliability in the following ways. During temperature cycling, planar microvoids initiate cracks sooner, propagate cracks faster and the effect is proportional to density of planar microvoids existing in the crack growth plane.

Figure 2:
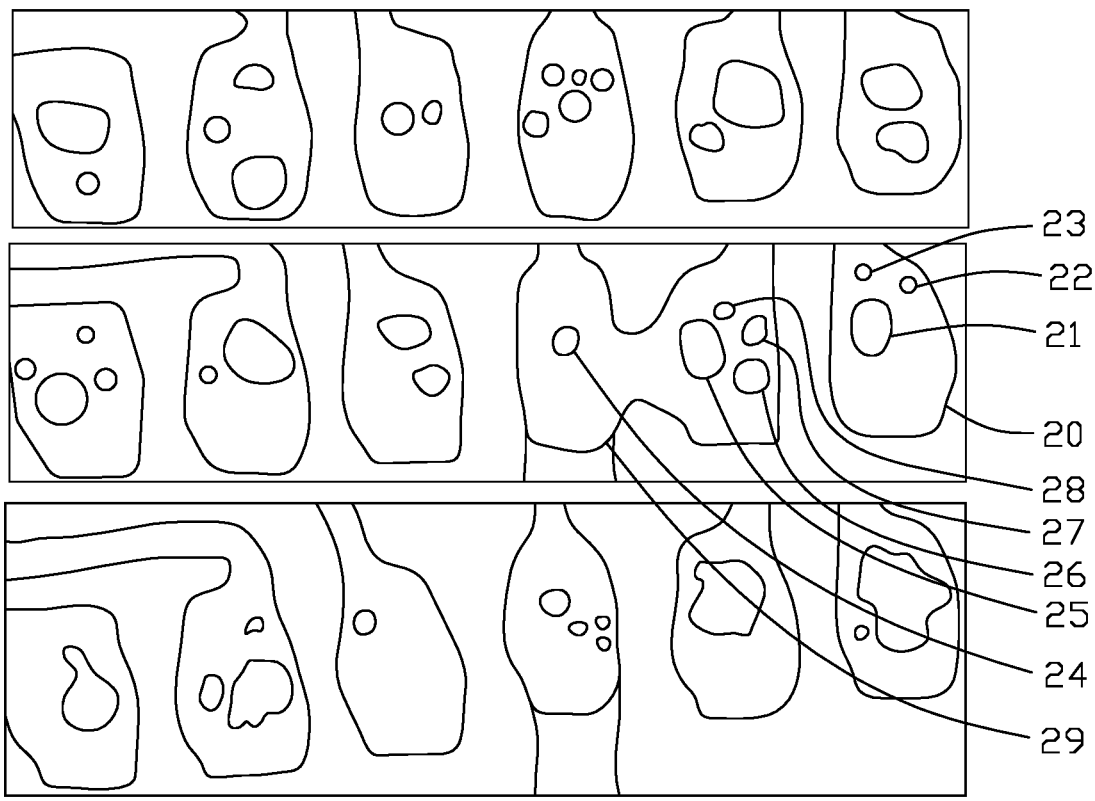
FIG. 2 is a magnified X-ray view of several solder joints illustrating voids therein.

As can be seen in the enlarged X-rays of several solder joints shown in FIG. 2, voids can form in various sizes 21, 22 and 23 within a single solder joint 20, or can even bridge several solder joints as shown by the voids 24, 25, 26, 27 and 28 in solder joint connection 29. Through intensive investigation, the present inventors have found that the root cause of the failure of the solder joint is not through a defect in the solder itself, nor in the various components of a soldering composition, including fluxes used therein, but rather is a defect caused by voids formed at the gold/copper substrate interface upon which the solder joint is subsequently formed. These voids may be created by improperly plating the substrate with the plating metal. For example, as shown in the schematic illustration of an immersion plating process in FIG. 9, a PENC system hoist 90 can lower a rack 91, containing a plurality of copper substrates 92, 93, into an electrochemical plating bath contained in cell 94. Within the electrochemical bath are typically an electroplating solution containing the dissolved metal to be plated, an acidic component to maintain the metal to be plated in solution and an anode 95, which may be placed within cell 94, or made integral with the cell 94. An external current can be supplied by a rectifier to provide the DC plating current. Rack 91 transfers a potential to the copper substrates 92, 93 such that the plating metal in the plating bath is drawn under the influence of an electric current towards the substrate 92, 93, which acts as a cathode, and causes the plating metal to be deposited on the surface of the copper substrate as solid metal.

Figure 3:
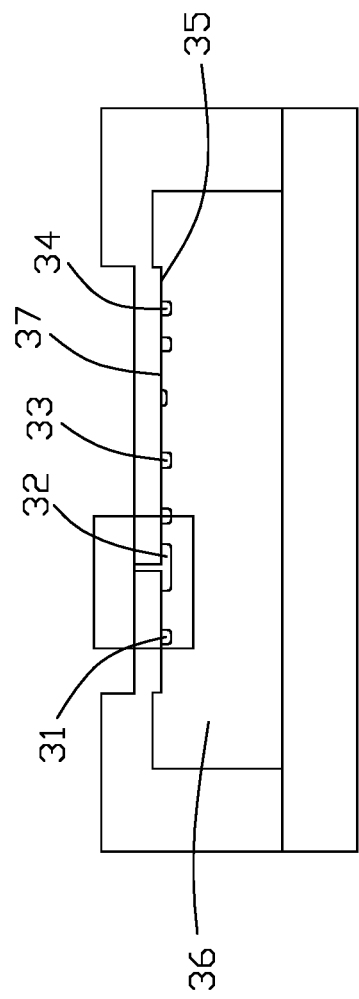
FIG. 3 is a schematic illustration of a metal plating on a substrate and the formation of caves beneath the plating, wherein the caves may be covered by the plating metal or be open though the surface of the plating metal.
Figures 4A, 4B, 4C, 4D:
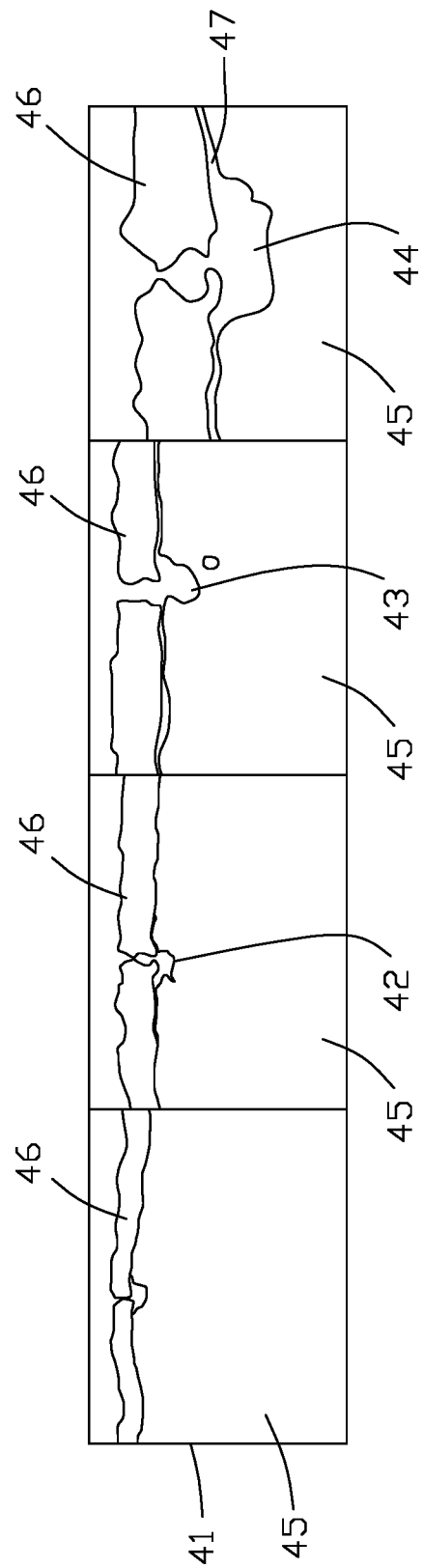
FIGS. 4A-4D are a series of photomicrographs illustrating various cave formations beneath a plated metal.

As a result of studying the defects in the solder joint, we have discovered that the plating process itself is the root cause of failure in the solder joint. Looking at the schematic representation of FIG. 3, it can be seen that a plurality of "caves" 31, 32, 33 and 34, or minute voids, are created in the interface 35 between copper substrate 36 and the plating metal 37. The caves/voids can lead to failure of the subsequently formed solder joint in several ways. Firstly, outgassing can occur at cave locations, primarily from the trapping of air, water and/or flux in the cave. Outgassing displaces solder at the cave locations. Secondly, the walls of the caves can oxidize or corrode leading to complex galvanic corrosion between the copper substrate, the plating metal and the corroded component. Thirdly, the "roof" of plated metal over the cave may physically collapse during the soldering process exposing the cave beneath the surface. Fourth, if enough microvoids form, physical strength can be compromised. FIGS. 4A, 4B, 4C and 4 D are actual photomicrographs of several caves 41, 42, 43, 44, in a substrate 45 beneath a plated metal surface 46. Thus, whether or not the cave/void is initially exposed through the plating metal is not the only factor to be taken into account in whether a subsequent solder joint will fail. Over time and/or processing the cave may be exposed and make the subsequent solder joint vulnerable to failure. Cave 44 actually illustrates the problem of corrosion 47 on the walls of the cave. The caves are created by the action of the plating bath in contact with the substrate before application of the plating current begins. This action can be thought of as corrosion, pitting or other surface defects caused by the substrate immersion in the plating bath due to components in the plating bath before the application of the external current. The corrosion is especially noticeable in baths of $Au(CN)_2^-$, $Au(CN)_4^-$, $AuCl_4^-$, and baths containing $AuSO_3^-$ will also suffer from this same problem. As it generally takes some time to lower the substrate of FIG. 9 into the bath, both corrosion and initial nucleation can proceed until the plating current is initiated, which is usually after the substrate is fully immersed in the bath. Attempting to force lowering at a faster rate might cause physical disruption (e.g., bending) of the substrates. In the present process, the process control is preferentially set up so that no area of the substrate is exposed to the bath for more than 1 second without the externally applied current. This "live entry" into the plating bath prevents subsequent formation of caves and voids as follows. Firstly, there will be no corrosion caused to the substrate metal being exposed to the acidic bath. This corrosion will create the caves at the plating/substrate interface when the substrate is immersed in the plating bath but before the application of electrical current sufficient to cause plating. Secondly, immersion of the substrate into a plating bath without the application of a plating current creates widely dispersed nuclei sites on the substrate. These widely dispersed nuclei sites preferentially initiate plating which creates a void beneath the plating and thus is also a root cause of solder voids/failure when the plated substrate is exposed to soldering as explained below.

Figure 8:
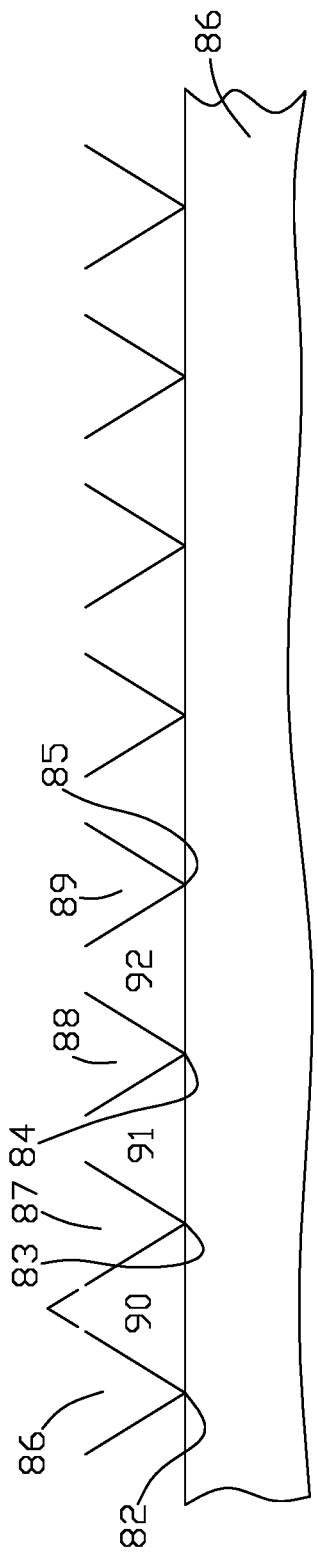
FIG. 8 is a schematic representation of grain growth in nuclei containing copper substrate as plated with gold.

The defect in creating widely dispersed nuclei sites is not a corrosion defect, and is not related to the creation of caves in the substrate caused by corrosion as discussed previously. However, the creation of the widely dispersed nuclei sites can also lead to failure of a subsequent solder joint. The mechanism of such failure has to do with plating formation and grains growing from these widely dispersed nuclei sites until the grain growth merges with the grain growth from an adjacent nuclei site. Beneath the merged grains is a void beneath the merged grain growth and the surface of the substrate. For example, taking gold, as the driving force to cyanide, complexes the copper and makes the displacement preferred. Once you have the gold islands of nuclei, no more preference for nucleation occurs later in the plating process. The process is then driven by growth of the initial nuclei. This growth from the initial nuclei proceeds as an inverted cone shape. As the adjacent cones grow together, they form voids beneath the merged cones as explained below with regard to FIG. 8. Upon energization of current on a submerged substrate, the nuclei on the substrate will tend to plate disproportionately to other portions of the substrate. As illustrated schematically in FIG. 8, where 81 represents the copper substrate, and 82, 83, 84, 85, etc. represent nuclei on the surface of the copper substrate, upon initiating plating of gold upon the copper substrate, grain growth begins at the nuclei 82, 83, 84, 85 and tends to grow outwardly as illustrated by grains 86, 87, 88 and 89 until adjacent grains grow together. Beneath such adjacent grains 86 and 87, there is a void 90 formed. Similarly, beneath grains 87 and 88 that grow together is a void 91. Also void 92 is formed between the merged grains 88 and 89. As this process is repeated over the surface of the substrate, it will be appreciated that many additional voids will be formed at the interface of the plating metal and substrate that are not due to corrosion, caves or voids in the substrate itself. Thus, it is the intent of the present inventors to prevent microvoids at the interface of the gold/copper substrate whether formed by initial corrosion of the copper substrate, or whether formed by immersion formation of widely dispersed nuclei on the copper substrate surface, leading to preferential grain growth of gold formed during subsequent plating under the effects of an external current.

Faced with the root cause of the defects in subsequent solder joints, the present inventors discovered various ways of preventing these interface defects between the plating metal and substrate that lead to subsequent failure of a solder joint formed thereon.

Figure 9:
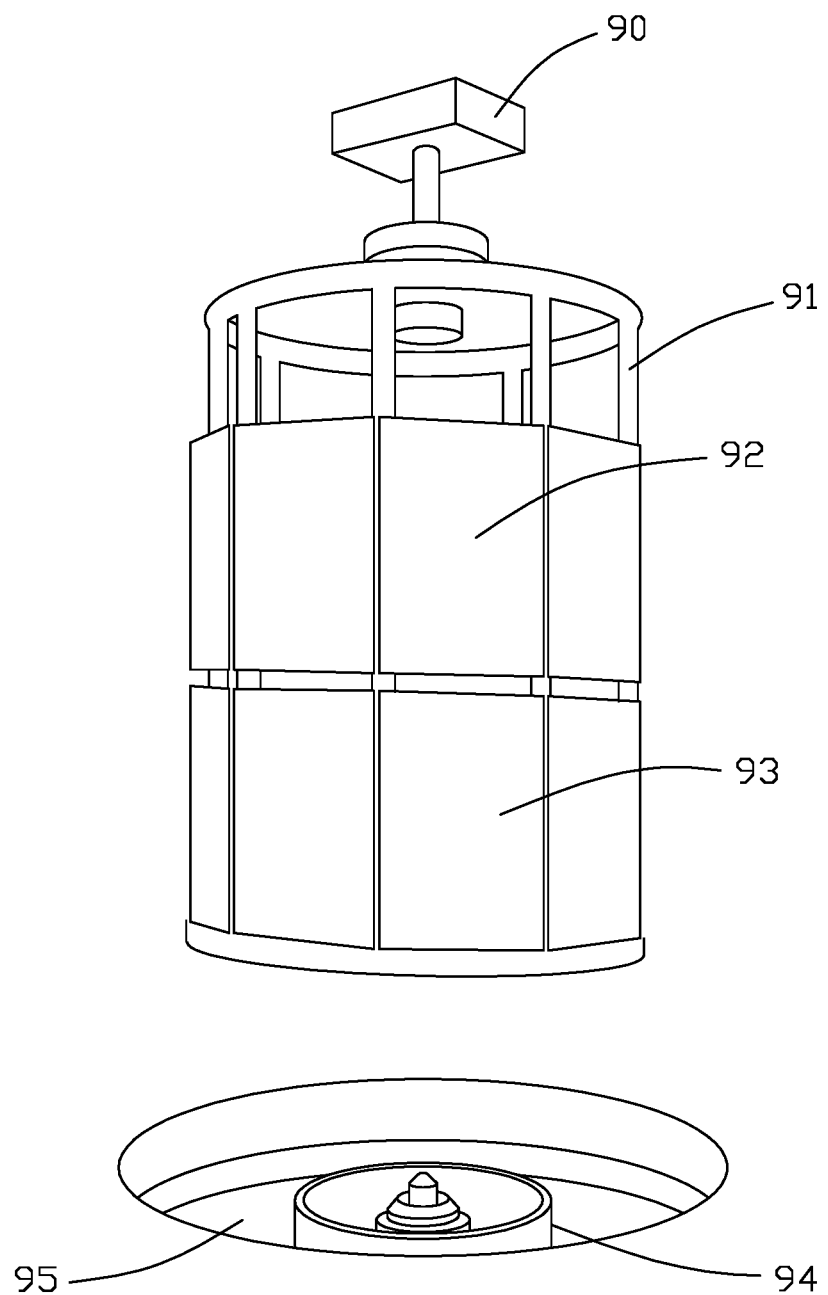
FIG. 9 is a schematic illustration of a commercial PENC hoist system to lower a rack into a plating bath.

In the simple immersion plating apparatus illustrated in FIG. 9, it takes several seconds to up to a minute, or more, to lower the rack 91 with the hoist 90 into the plating bath contained in the cell 94. After lowering of the rack is completed such that the panels are completely submerged, and with only a second or two after immersion is complete, the power is switched on. Dropping the panels into the immersion bath at a faster pace may cause bends in the substrate. We have found that this slow immersion permits the components of the plating bath to corrode the substrate forming pits, voids, or other surface defects in the substrate. Additionally, there is a certain amount of time where the copper substrates are exposed to the gold strike plating bath without current being applied, forming the potential nucleation sites across various parts of the substrate. After the submersion of such a substrate in the plating bath, and when the electric current is subsequently turned on after the substrate is immersed, the plating commences upon the corroded substrate surface creating the caves previously discussed. Secondly, the widely dispersed nucleation sites formed by immersing the substrate into the plating bath in the absence of applied plating current, creates the disproportionate grain growth about these nucleation sites to the exclusion of subsequent preference of nucleation when the plating current is applied causing the formation of voids beneath the merged grains grown about the widely dispersed nuclei sites.

Figure 5:
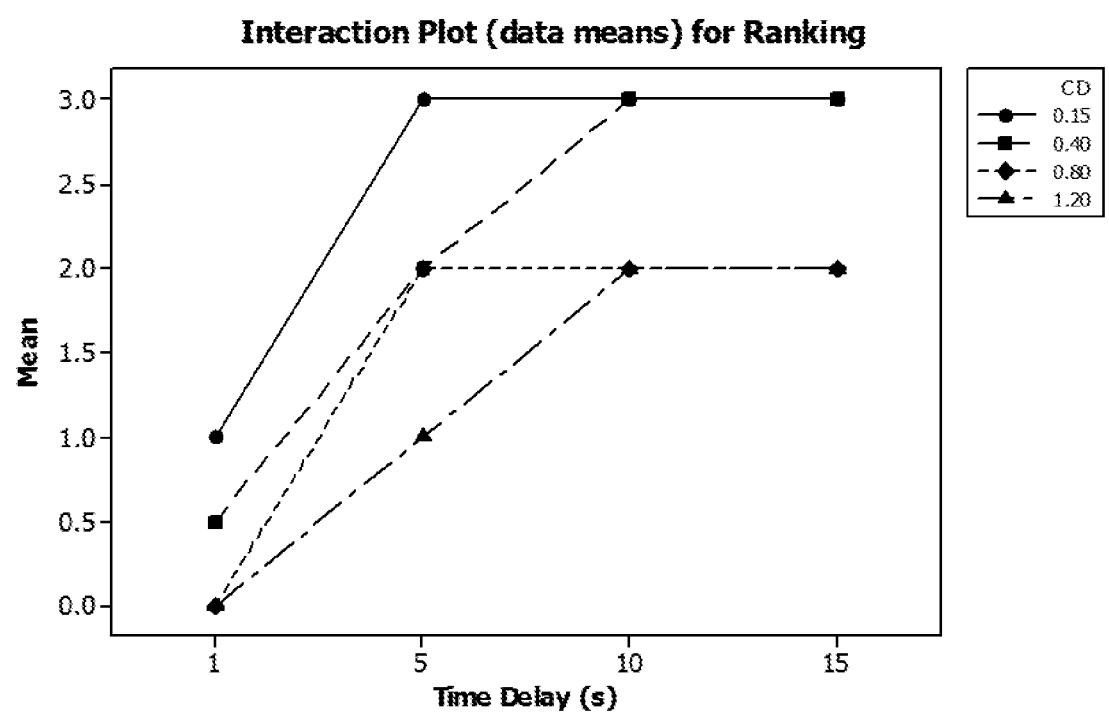
FIG. 5 is a graphic representation of a "live entry" method of lowering a plating rack with panels into a gold strike bath such that immersion plating is suppressed.

Our process according to one embodiment requires that a plating current be initiated as soon as the substrate contacts the plating bath. That is, as soon as the substrate is wet by the bath. The key is to apply current as you are just wetting. This initial plating or strike may be used to form a very thin plating, typically about 1-3 microinches is safe, with high quality and good adherence to the substrate. This serves as the foundation to the subsequent thickness built up as plating continues. Not only does the early initiation of plating prevent the corrosion of the substrate by the components in the bath, but the continuous plating prevents the formation of widely dispersed nuclei on the surface of the substrate before plating begins. A graphical representation of an interaction plot (data means) for ranking (mean vs. time delay) is found in FIG. 5. The gold strike should be operated at a current density of 2-10 times that of the plating current. Our preferred range is 4-5 times, with 4.5 being most preferred. The live-entry of the substrate into the bath at a current density high enough to initiate strike also reduces the amount of copper that flows from the substrate into the bath. Copper in the bath is detrimental to the proper function of the gold plating process. The strike bath gets loaded with copper through immersion plating as the rack is lowered into the bath without strike current being passed through the bath. A bath containing copper means that copper will co-deposit with and on gold through under potential deposition. This is another advantage of the disclosed live-entry process over conventional immersion deposition, that is, not initiating plating current until the substrate is fully immersed in the bath.

Figure 6:
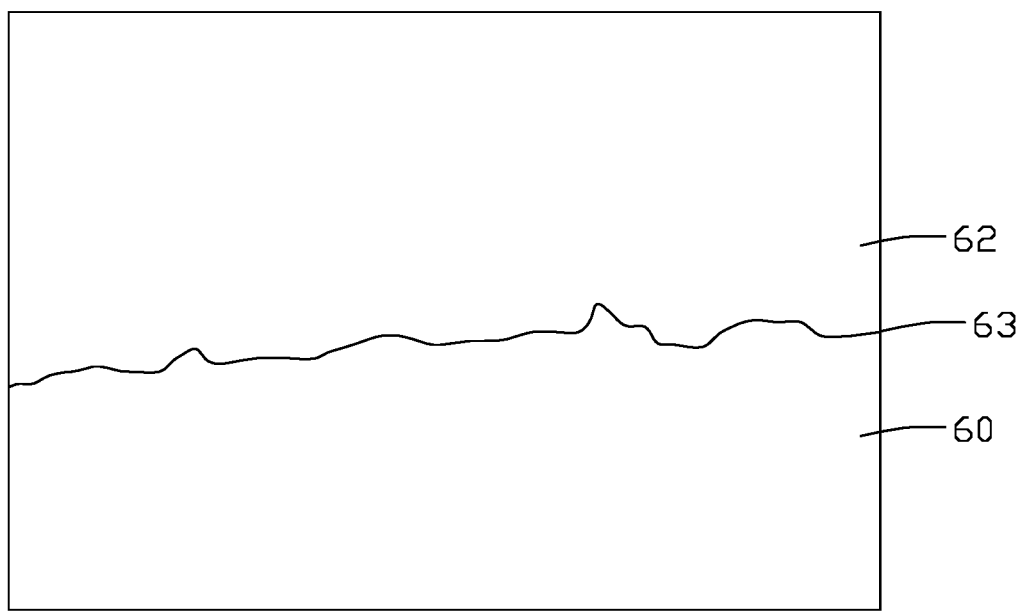
FIG. 6 is a photomicrograph at 30 K X illustrating the improvement in the gold plating and the resulting dramatic improvement of the resulting solder bond with respect to absence of voids.

In another embodiment of our method, we increase the external plating current from the rectifier to that corresponding to near the mass-transfer-limit for gold deposition. In the PENC hoist system, that is a minimum of 6 ASF ("amps per square foot"), although a nominal of 9 ASF is preferred. An upper boundary of 12 ASF is shown to be good with points in between exhibiting good performance. Thus, the strike current lies in the range of 6-12 ASF. The usual current density for the gold strike is far too low to break epitaxial heterogeneous nucleation of gold. Also, a rough surface of the copper substrate tends to incur differential mass transfer resulting in preferential localized nucleation. By increasing our current density to that above the mass-transfer limit for gold, uniform and dense nucleation occurs with a pore free nature. No evidence of nucleation voids can be seen by cross-section FIB at 30K X at the gold/substrate interface 63 of FIG. 6, where the substrate is 60 and the gold plating is 62.

Figure 7:
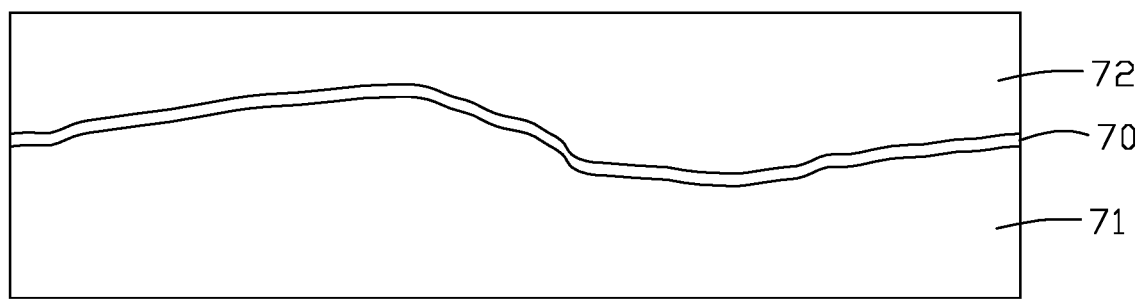
FIG. 7 is a photomicrograph of a cross-section of a 1 micro-inch strike made according to the present disclosure.

Also as seen in the FIB cross-section of 1 micro-inch strike of FIG. 7, the interface 70 between the substrate 71 and gold plating 72 contains no voids.

As explained above, both live entry and increased current density are necessary to limit the corrosion of the substrate and accomplish proper nucleation of the substrate. Although each of live entry and increased current density solve one or more problems, combining the two techniques substantially prevents failure of solder joints due to microvoids in the plated substrates.

The gold plated copper substrates can be part of, or thereafter be incorporated into, PCBs. PCBs generally comprise a laminate of copper and an electrical dielectric polymer. The copper or other metallic substrate can be etched or otherwise formed into a circuit by techniques well known in the art. The gold plated copper substrates of this disclosure can form metal defined lands or soldermask defined lands in the PCB of the type illustrated in FIG. 1, without the risk of creating voids in the solder joints. It should be expressly understood that the particular printed circuit within the PCB of FIG. 1 is illustrative only and that many other types and design of PCBs are well within the skill of those in the art. All such PCBs can benefit by the teachings of this disclosure.

Figure 10:
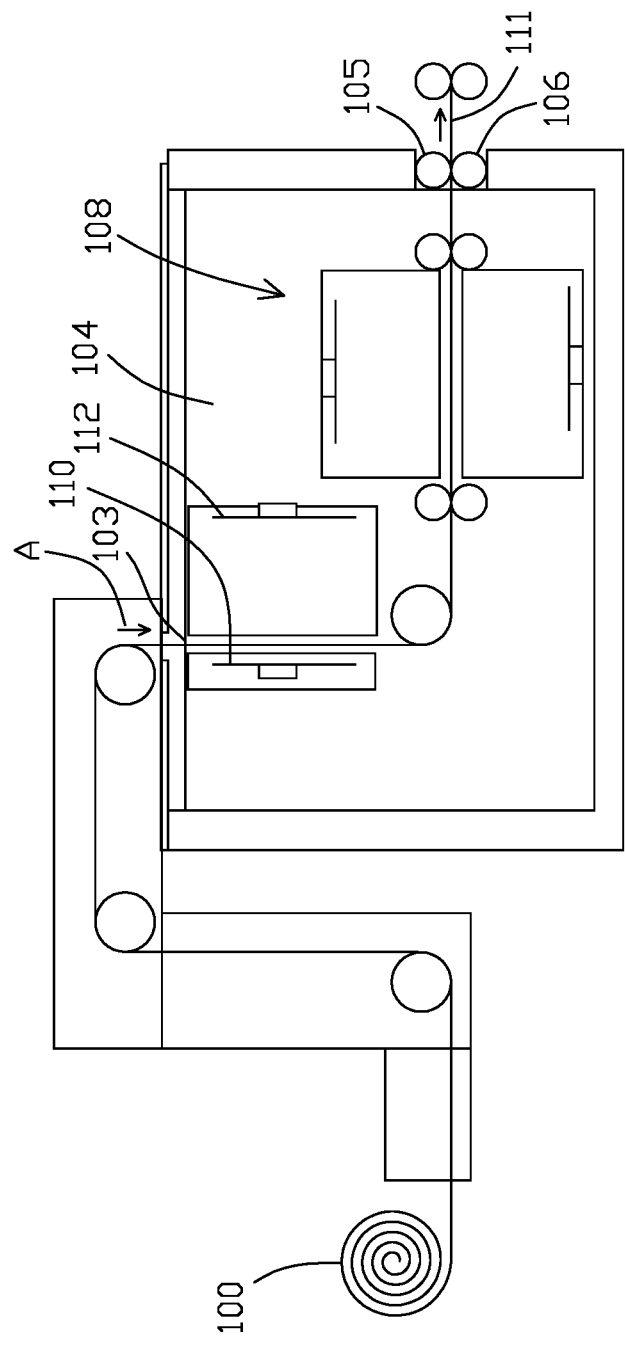
FIG. 10 is a schematic illustration of the live entry being applied in a continuous vertical entry electrochemical plating process; and, FIG. 11 is a schematic illustration of the live entry being applied in a continuous horizontal entry electrochemical plating process.

Although we have initially described the plating process with regard to lowering a substrate into the plating bath, our live entry technique is also applicable to other types of plating methods and apparatus, such as reel to reel plating of a continuous or indefinite length substrate. For example, as shown in FIG. 10 is a reel-to-reel plating apparatus and method utilizing live entry in a vertical orientation. By modifying existing apparatus to permit the continuous or indefinite length substrate 100 on reel 102 to enter the strike bath 104 in a vertical orientation, rather than in a horizontal direction as is the case with existing apparatus, and with live entry, that is the application of the plating current to the substrate 100 as soon as it enters the bath or within one second after entering the bath, immersion corrosion or widely dispersed nucleation of sites on the substrate 100 could be avoided in the same manner as discussed in relation to the PERC hoist system above. Such a period of time is sufficient to prevent corrosion or immersion nucleation of the substrate. Optimal configuration in a vertical entry by the configuration of the first set of anodes 110, 112 with respect to the liquid bath level 103 should not allow more than 1 second immersion of substrate 100 in the strike bath 104 without full applied current. For a minimum 1 meter/minute web speed, the anode 110, 112 should be less than 1 inch below the level of liquid bath 103. Vertical entry into bath 104 is shown at arrow A. Vertical live entry can be combined with horizontal plating as shown generally by the dotted line at 108 in FIG. 10. The dotted line 108 represents the actual plating zone as compared to the strike bath 104. Plating bath 113 exists in plating zone 108 between anodes 120 and 122. A first set of rollers 124, 125 conveys the substrate 100 into the plating bath 113. A second set of rollers 126, 127 is primarily to maintain plating bath 113 separate from strike bath 104, utilizing any known means such as seals (not shown) to prevent plating bath 113 from exiting the plating zone 108. Anodes 120, 122 supply sufficient current to cause Au plating over the Au strike to a desired thickness. Zone 108 is not drawn to scale and can be of such dimensions to cause plating to a desired thickness during the residence time of substrate 100 within zone 108. After reaching the desired thickness, the plated substrate exits plating zone 108 with the aid of rollers 128, 129. The coated substrate 111 is drawn through, and ultimately removed from the plating apparatus with rollers 105, 106 and deposited on reel 101.

FIG. 11 illustrates an alternative form of reel to reel plating utilizing conventional horizontal plating apparatus 130. A substrate 131, which could be unwound from a reel (not shown) or other source enters horizontal plating apparatus 130, by virtue of rollers 132, 133. Immediately upon entering apparatus 130, or within 1 second of entering, a strike plating is formed on substrate 131 by virtue of applying DC current to anodes 137, 138 in strike bath 139. Strike bath 139 can be of a similar nature as strike bath 104 as discussed in connection with FIG. 10. A very thin strike coating is desired to prevent undesired nucleation of the surface of substrate 131. Upon formation of the Au strike on substrate 131, the strike plated substrate is conveyed into plating bath 136. DC current applied to anodes 134, 135 create a plating of desired thickness on the strike. After the desired thickness of plating is electrodeposited, the plated substrate is removed from plating apparatus 130 by rollers 140, 141.

Although the present disclosure solves the problem of plated PCB components, it has a much broader application for many metal plating problems.

We have provided examples of the methods and techniques that we employ to assure that the presence of microvoids at the interface of the gold/copper substrate are prevented or avoided. It should be understood that these methods and techniques are only exemplary and not limiting. Those skilled in the art, to which this disclosure is directed, will readily envision steps and techniques to employ this disclosure without the exercise of inventive effort.

What is claimed is:

1. A method of plating at least one metal selected from the group consisting of platinum, palladium, silver, and gold on a copper substrate comprising:
    vertically lowering the copper substrate into a strike bath such that a surface of the copper substrate to be plated is substantially perpendicular to an upper surface of the strike bath as it is lowered, the strike bath containing the at least one metal as an only plating metal and an acid for maintaining the at least one metal in solution;
    applying a first current through the strike bath to plate a strike onto the copper substrate, wherein the current is generated by an anode located at a predetermined distance from the upper surface of the strike bath such that a full amount of the first current is applied to the copper substrate within 1 second of immersion in the strike bath, the predetermined distance based on a speed of the lowering;
    horizontally moving the copper substrate with the strike into a plating bath; and
    applying a second current through the plating bath sufficient to form a plating over the strike, wherein a current density of the first current is 2-10 times greater than a current density of the second current.

2. The method of claim 1, wherein the at least one metal is gold.

3. The method of claim 1, wherein the current density of the first current is raised to a point wherein a metal mass-transfer-limit is exceeded.

4. The method of claim 1, wherein the current density of the first current is raised to a range of 6-12 amps per square foot (ASF).

5. The method of claim 1, wherein the strike bath comprises ions selected from the group consisting of $Au(CN)_2^-$, $Au(CN)_4^-$, $AuCl_4^-$, and $AuSO_3^-$.

* * * * *